United States Patent [19]
Guest

[11] 4,083,014
[45] Apr. 4, 1978

[54] FREQUENCY LOCK LOOP

[75] Inventor: Ashley W. Guest, Bristol, England

[73] Assignee: British Aircraft Corporation Limited, London, England

[21] Appl. No.: 731,860

[22] Filed: Oct. 12, 1976

[30] Foreign Application Priority Data
Oct. 17, 1975 United Kingdom ............... 42615/75

[51] Int. Cl.² ............................................. H03B 3/04
[52] U.S. Cl. ..................... 331/1 A; 331/8; 331/11; 331/17
[58] Field of Search ................... 331/153, 111, 11, 17, 331/18, 8, 20, 28, 1, 1 A

[56] References Cited
U.S. PATENT DOCUMENTS
3,005,165 10/1961 Lenigan ................................ 331/11
3,376,518 4/1968 Emmer ................................ 331/153

Primary Examiner—John Kominski
Attorney, Agent, or Firm—Stevens, Davis, Miller & Mosher

[57] ABSTRACT

A frequency lock loop circuit has a pair of square-wave pulse generators which are clocked from a common input. The width of the pulses from the first generator is dependent on the frequency of the clocking signal; the width of the pulses from the second generator is dependent on a reference frequency. The difference in the width of the pulses from the two generators is fed back as an error signal to adjust the frequency of the clocking signal until the two waveforms are aligned. In a heterodyne receiver, the clocking signal may be the intermediate frequency signal from the mixer and it may then be adjusted by adjusting the frequency of the local oscillator in accordance with the pulse-width difference signal.

6 Claims, 6 Drawing Figures

FREQUENCY LOCK LOOP

In a radar receiver where frequency lock is operated to align a local voltage controlled oscillator (VCO) with an incoming RF pulse, the frequency resolution is improved if the frequency lock loop has a phase lock capability under frequency jitter conditions.

However phase lock loops have a damped oscillatory characteristic where the frequency excursion required to achieve phase lock is proportional to the phase difference and to the rate at which phase lock is required. Therefore a frequency lock loop without phase lock capability has a faster response but a reduced frequency resolution.

An object of the present invention is to achieve a frequency lock loop without phase lock capability and hence with a fast response, but which also has an adequate frequency resolution.

Analogue frequency lock loops are already known but these would not be capable of detecting RF pulses having a duration of, say, 100 nanoseconds with a frequency resolution of the order of kilocycles. Such resolution is critical, for example, in frequency regenerators where the regenerated frequency must lie as close as possible to the incoming RF frequency. The present invention is thus particularly concerned with a digital frequency lock loop (without phase lock capability) which has a fast enough response to detect RF pulses of 100 nanoseconds but which also has a frequency resolution which enables it to align a local oscillator to within a few kilocycles of a required RF frequency.

In accordance with the present invention a digital frequency lock loop comprises a pair of square-wave pulse generators clocked from a common input, first means for controlling the width of the pulses from a first of the generators such that the width is dependent on the frequency of the clocking signal, second means for controlling the width of the pulses from the second generator such that the width is fixed in accordance with a reference frequency, a comparator for comparing the two resulting pulse waveforms to derive an error signal proportional to the difference in the widths of corresponding pulses in the two waveforms, and a feedback circuit responsive to the error signal for adjusting the frequency of the clocking signal until the two waveforms are aligned with one another. The reference frequency can be derived either by the use of a crystal oscillator which initially provides the clocking signal to set up a reference value for controlling the width of the pulses from the second generator when the normal clocking signal is substituted for the crystal oscillator, or by means of a time delay circuit which automatically terminates each of the pulses in the first waveform after a predetermined delay. In the latter case the delay is preferably adjustable in order to permit adjustment of the reference frequency.

The invention has particular application in a heterodyne receiver. In this case the clocking signal comprises the IF signal obtained from the mixer, and the frequency of the IF signal is adjusted by adjusting the frequency of the local oscillator in accordance with the value of the error signal.

In order that the invention may be more clearly understood, one example of a frequency lock loop embodying the invention will now be described with reference to the accompanying drawings in which.

Figure 1:
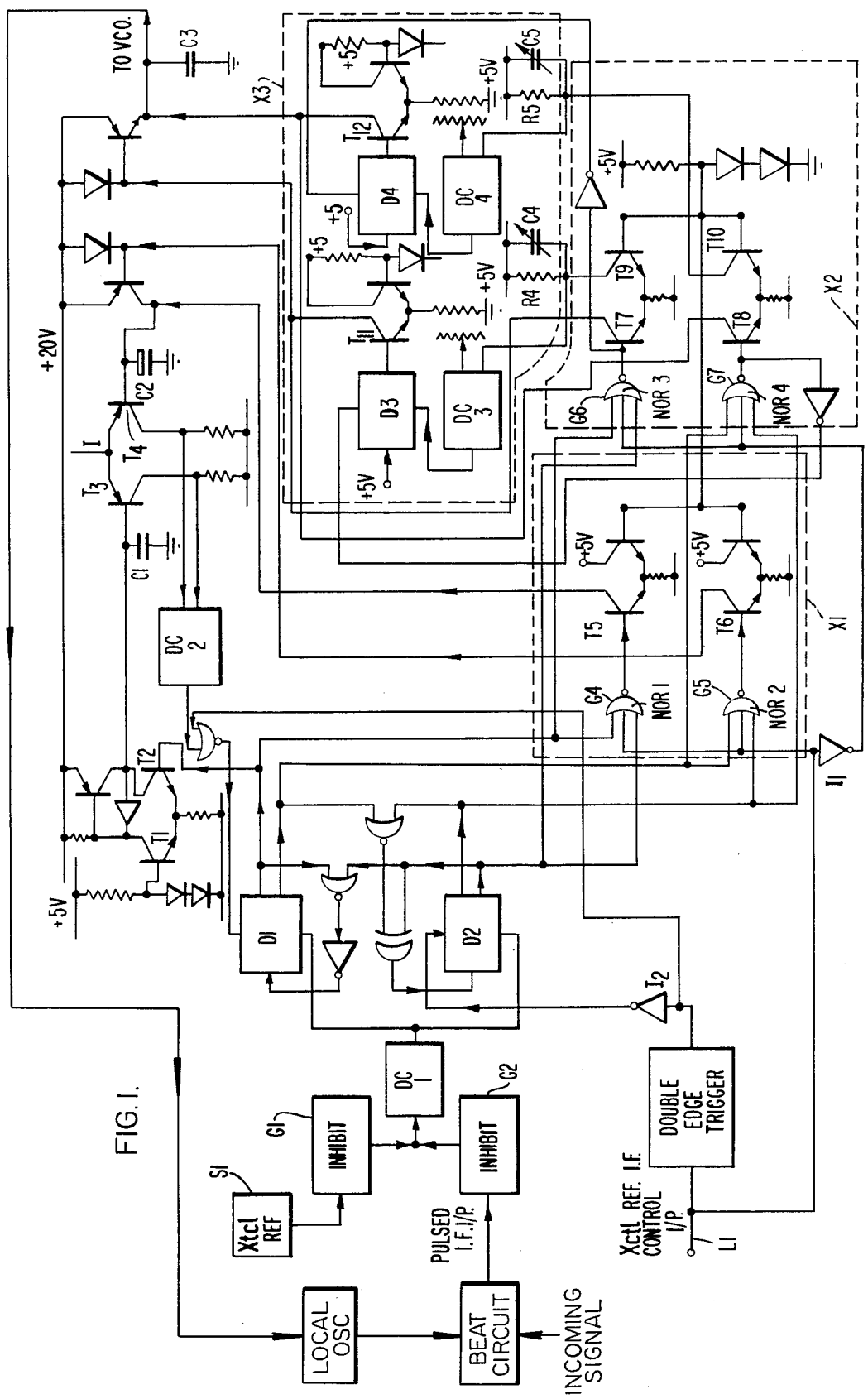
FIG. 1 is a block circuit diagram of a frequency lock loop for use in a heterodyne receiver.

The frequency lock loop illustrated in FIG. 1 forms part of a digital frequency regenerator which is more fully described and separately claimed in our copending application No. 27621/75. The object of the frequency lock loop is to lock an incoming IF signal to a predetermined reference IF frequency, any error between the two frequencies being fed back to control the voltage of a voltage controlled local oscillator so that the IF is varied until the error reduces to zero. The circuit of FIG. 1 operates essentially as follows.

A pair of D-type edge-triggered bistables D1 and D2 are both clocked from a common digital comparator DC1 which receives an input either from a crystal oscillator S1 or from the mixer (not shown) of the heterodyne circuit. The output from the mixer is a pulsed IF waveform produced by mixing received RF pulses with the output of a voltage controlled local oscillator.

Initially gate G1 is inhibited so that the bistables D1, D2 receive an input from the crystal oscillator S1. The digital comparator DC1 merely produces a logic compatible waveform. The leading edge of the first pulse from the digital comparator changes the Q output of D1 and D2 to logic 1 and thereby starts a ramp waveform which is generated by a ramp generator consisting of transistors T1, T2. The output from the ramp generator controls the voltage on a capacitor C1, and when the voltage on C1 equals the voltage on a second capacitor C2 an output from a voltage comparator DC2 resets D1. Thus the width of the pulses from the bistable D1 is determined by the time taken for the capacitor C1 to charge to the voltage of the capacitor C2. While bistables D1, D2 are being clocked by crystal oscillator S1, the voltage on capacitor C2 is controlled by means of an error signal which is derived by comparing the outputs of D1 and D2 in a first feedback control circuit X1. Since D2 is triggered by the positive edges of the clock input (because of the feedback from the Q output to the D input) this means that the voltage on C2 is adjusted in response to the error signal until the output from D1 is a half period waveform having the same duration as one complete cycle of the crystal reference frequency. This waveform can be reproduced as long as the same voltage is maintained on the storage capacitor C2.

Once the voltage on the storage capacitor C2 has been set (this occurs after a few cycles when the output pulses from D1 and D2 are coincident) the gate G2 is inhibited and gate G1 is enabled so that the pulsed IF input is now used to clock bistables D1, D2. At the same time a control input on line L1 changes state and thereby inhibits a pair of NOR gates in the first feedback control circuit X1. The inhibiting of these two gates prevents any further change in the voltage stored on capacitor C2.

The same logic signal on line L1 is fed through inverter I1 to enable a second pair of NOR gates in a second feedback control circuit X2 which also receives the outputs from D1 and D2. The error signal therefore now controls the voltage on a capacitor C3 and thereby the frequency of the local oscillator producing the IF. Thus, during this period when the bistables are clocked by the IF input, the output pulses from D1 have a fixed width determined by the voltage stored on capacitor C2 and the frequency of the local oscillator is varied until the output pulses from D2 are aligned with those from D1. The IF is then locked to the crystal frequency.

The logic gating between bistables D1, D2 ensures that D1 and D2 are only clocked from 0 to 1 together. This logic gating acts as a NOR gate to D2 input and an OR gate to D1 input. After the bistables have been clocked from 0 to 1 by a positive-going edge at the clock input, the NOR gate allows D2 to be clocked back to 0 by the next positive-going edge of the clock but prevents further clocking until D1 is also at 0. The OR gate prevents D1 being clocked from 1 to 0 regardless of the state of D2. D1 can only be returned to 0 by a signal from comparator DC2. Since D1 may be reset to 0 before or after D2 (thus generating the appropriate error signal) the OR and NOR gates must further ensure that neither D1 nor D2 can be clocked from 0 to 1 until both are at 0.

The control input on line L1, which selectively inhibits the two feedback control circuits X1, X2, also operates a double-edge trigger which simultaneously resets both bistables D1, D2 to their 0 state and thereby synchronises their operation. The double-edge trigger is connected to the clear input of D2 through an inverter I2 and to the clear input of D1 through a NOR gate G3 shared with the output of comparator DC2.

Figure 2A:
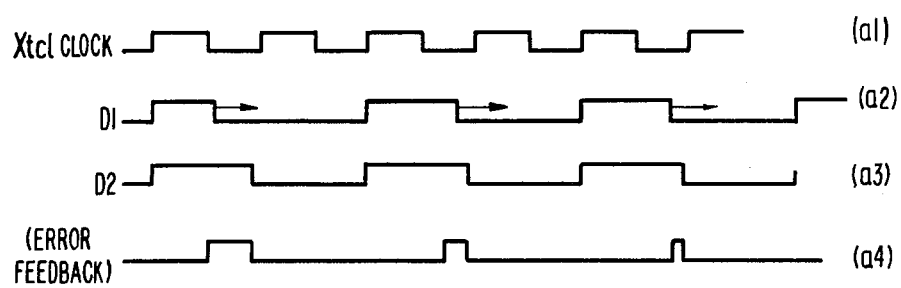
FIG. 2a–2d is a waveform diagram illustrating the operation of the frequency lock loop.
Figure 2B:
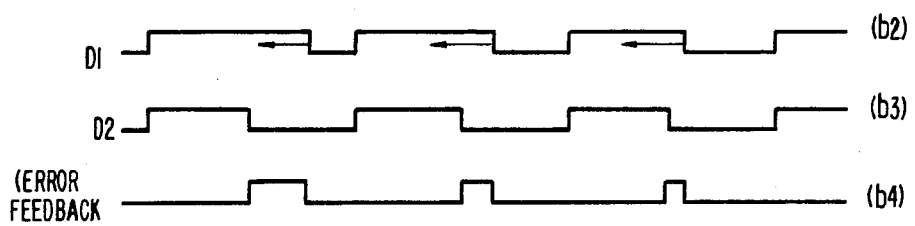
Figure 2C:
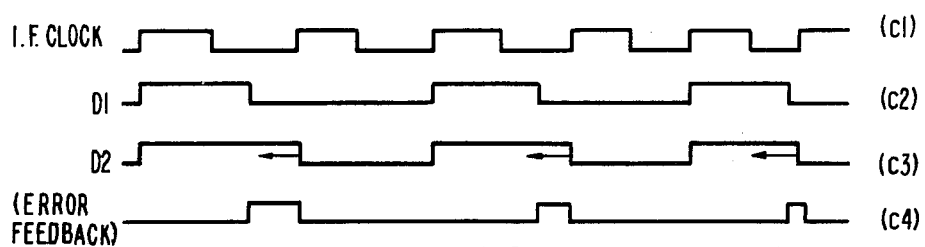
Figure 2D:
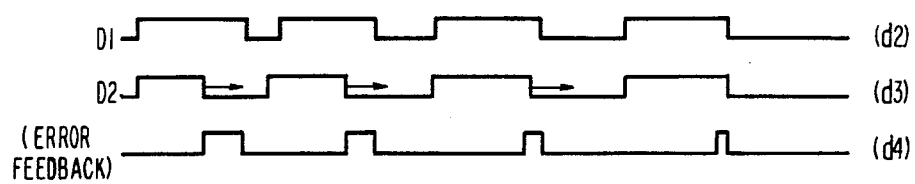

FIGS. 2a and 2b illustrate the operation of the circuit during the time gate G1 is inhibited and the bistables D1 and D2 are therefore receiving the crystal clock input. The output at DC1 is the waveform (a1). The Q outputs of D1 and D2 are shown as (a2) and (a3) where the error signal (a4) increases the width of the D1 pulses, and as (b2) and (b3) where the error signal (b4) decreases the pulse widths. FIGS. 2c and 2d show the corresponding waveforms during the time gate G2 is inhibited and the bistables D1 and D2 are clocked by the IF input.

It can be seen from FIG. 1 that the two NOR gates G4, G5 in the control circuit X1 as well as receiving the control input along line L1 also respectively receive the Q output of D1 and the Q output of D2, and the Q output of D1 and the Q output of D2. The truth tables for the NOR gates are as follows

| NOR - 1 | | | | NOR - 2 | | | |
|---|---|---|---|---|---|---|---|
| L1 | D1Q | D2Q | T5 Base | L1 | D1Q | D2Q | T6 Base |
| 0 | 1 | 0 | 0 | 0 | 0 | 1 | 0 |
| 0 | 1 | 1 | 0 | 0 | 0 | 0 | 1 |
| 0 | 0 | 1 | 0 | 0 | 1 | 0 | 0 |
| 0 | 0 | 0 | 1 | 0 | 1 | 1 | 0 |

It can be seen from the above truth tables that, according to the relative times at which the bistables are switched, the transistors T5 and T6 will reduce or increase respectively the voltage on storage capacitor C2 until the pulse width of the pulses from D1 are aligned with the period of the crystal oscillator S1.

A similar pair of NOR gates G6, G7 in the control circuit X2, operate a corresponding pair of transistors T7 and T8 which control the voltage on C3.

The above described circuit has a fast response because there is no phase lock, and also a frequency resolution of 0.1% of the intermediate frequency for a continuous input waveform and better than 0.5% for a pulsed input.

The IF coarse frequency control X3 shown in FIG. 1 is brought into operation where the frequency difference between the detected IF and the crystal reference is greater than can be corrected by the fine control circuit X2 within the given time. The coarse frequency control functions by measuring the width of the fine control feedback pulses, and it is removed by the change of the frequency feedback loop polarity. The oscillatory response thus generated is more than compensated for by the additional speed of the frequency lock loop.

In the coarse control circuit X3, the time constants R4, C4 (positive polarity) and R5, C5 (negative polarity) are set to detect when the pulse width of the error signal exceeds a certain predetermined value. These are operated when transistors T7 or T8 are switched on. This is detected by differential comparators DC3 (or DC4) which clock bistable D3 (or D4) to increase the rate of change of voltage on C3 via transistor T11 (or T12).

A fine control pulse (error signal) of the opposite polarity removes the coarse control by triggering the clear inputs of D3 (or D4).

The frequency capture range of the circuit is independent of the frequency lock loop band width, and is limited only by the frequency response of the circuit components. The circuit is particularly useful for RF pulse widths of 100n/secs and is able to follow frequency changes of the pulses by 30MHz or more between pulses.

To achieve a fast response and still be stable, a propagation delay which approaches the period of the IF waveform is required. Too low an IF will not provide sufficient data to achieve frequency lock in the RF pulse time.

Figure 3:
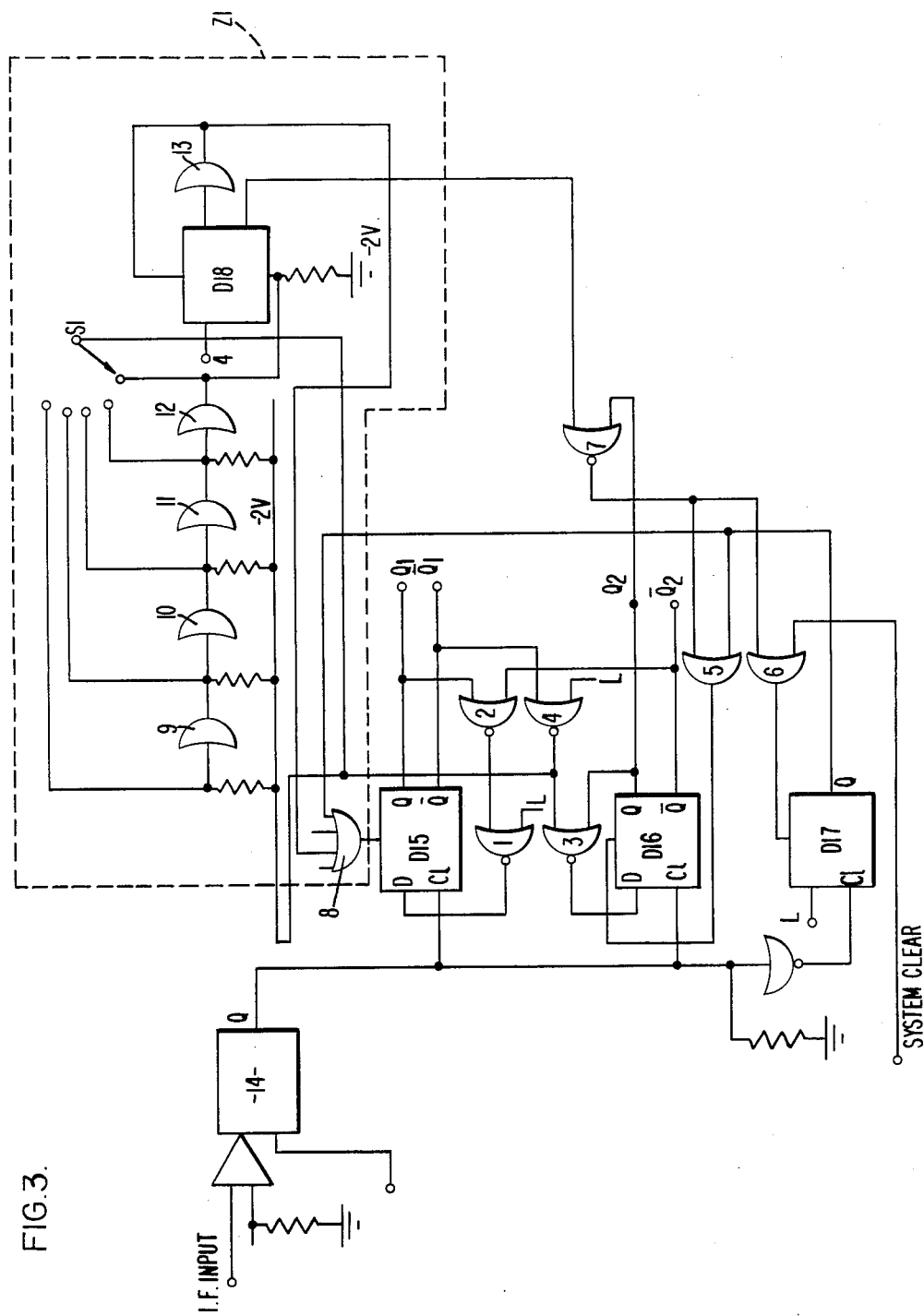
FIG. 3 is a circuit diagram illustrating an alternative method of deriving the reference IF frequency to that shown in the circuit of FIG. 1.

In the alternative circuit illustrated in FIG. 3, the RF pulses are fed directly to a circuit 14 which produces a logic compatible output. This output is used to clock the D-type flip-flops 15, 16 and 17.

In this circuit the reference frequency is not set by a crystal oscillator. Instead the reference is derived from a timing chain Z1. As in FIG. 1, the flip-flop D16 (corresponding to D2) is continuously clocked by the input to effectively divide the input frequency by two. The width of the output pulses from flip-flop D16 is thus dependent on the input frequency. The flip-flop D15 (corresponding to D1) is also clocked by the input signal but the trailing edges of the output pulses occur after a time controlled by the timing chain Z1. Thereafter the Q and Q outputs from the flip-flops D15 and D16 can be compared with one another and the resulting error signal can be used to control the voltage of a voltage controlled local oscillator in the same manner as in FIG. 1.

The output of flip-flop 17 inhibits flip-flops 15 and 16 and is used to ensure that both flip-flops are inhibited simultaneously at the end of an RF pulse in order to remove the frequency feedback. The flip-flop 17 has to be clocked by the input to allow flip-flops 15 and 16 to operate.

The flip-flop 15 is clocked high (logic 1) by the input signal but is reset low to logic 0 by the timing chain. The timing chain consists of gates 9, 10, 11, 12, a D-type flip-flop D18 and finally gates 13 and 8. A switch S1 controls which of the gates 9, 10, 11 and 12 are included within the chain and thus controls the delay inserted by the chain. The switch S1 is preferably an electronic switch and it provides a convenient method of adjusting the IF reference frequency.

The gates 1, 2, 3 and 4 between the flip-flops D15 and D16 provide the following functions:

1. They prevent D15 being clocked low when in the high state. (This must be done by the timing chain).
2. They prevent D15 being clocked high when in the low state, when the D16 is in the high state.
3. They allow D15 to be clocked high when both D15 and D16 are both in the low state.
4. The prevent D16 being clocked high when D16 is in the low state and D15 is in the high state.

The gates 7 and 5 are a precaution against D16 being clocked high before D15 is ready to be clocked. This could occur due to delays in the allow path (gates 1 and 2) into D15 being different to the delays in the allow path (gates 4 and 3) into D16. This can occur when D15 goes low just before an input clocking edge.

Therefore, when D16 is low and D15 is reset by the timing chain, D16 is reasserted to be low as well. D17 is then reset high and then removed by the input clock to ensure this function occurs properly.

I claim:

1. A frequency lock loop for adjusting the frequency of a signal to a desired frequency, comprising:
    storage means for storing a signal value representative of the said desired frequency;
    a first square wave generator connected to be clocked by the signal to be adjusted and defining thereby the initiation and termination of a first pulse period which is inversely proportional to the frequency of the said signal;
    a second square wave generator connected to be responsive to the said signal to initiate the generation of a second pulse period substantially simultaneously with the initiation of the first pulse period by the first square wave generator and responsive to the signal value stored by the storage means to terminate the said second pulse period after an interval, from its initiation, inversely proportional to the said desired frequency;
    a comparator for comparing the first and second pulse periods defined by the first and second square wave generators to derive a correcting signal varying with the difference in the durations of the said pulse periods; and
    a feedback circuit responsive to the said correcting signal for adjusting the frequency of the said given signal in a sense such as to reduce the difference in the durations of the two said square waves.

2. A frequency lock loop according to claim 1, further comprising means for establishing in a preliminary operation the value of the signal stored by the said storage means, the signal-establishing means comprising a crystal oscillator and means applying the output of the crystal oscillator to each of the first and second square wave generators, whereby the output of the first square wave generator is a pulse train having a pulse duration inversely proportional to the frequency of the crystal oscillator and the initiation of a pulse from the second square wave generator is controlled by the output of the crystal oscillator, the frequency lock loop further comprising means responsive to the value of the stored signal for terminating the output pulse from the second square wave generator after a period determined by the value of the said stored signal, a second comparator for comparing the outputs of the first and second square wave generators to derive a correcting signal varying with the difference in the durations of the pulse outputs of the square wave generators, and a second feedback circuit responsive to the said correcting signal to adjust the amplitude of the said stored signal in a sense such as to reduce the difference in the durations of the two said square waves, whereby the said stored signal is adjusted until the duration of the output pulse from the second square wave generator is equal to that of the first square wave generator and is therefore determined by the frequency of the crystal oscillator.

3. A frequency lock loop according to claim 2, further including a ramp waveform generator which is triggered by the leading edge of each pulse from the second square wave generator, means for resetting the second square wave generator whenever the ramp waveform reaches a stored voltage level, and means operative during the said preliminary operation for adjusting the stored voltage level in accordance with the value of an error signal representing the difference in width between the output pulses from the square wave generators, the said stored voltage level constituting the said stored signal value representing the desired frequency.

4. A frequency lock loop for adjusting the frequency of a given signal to a desired frequency, comprising:
    means for modifying the frequency of the said given signal;
    storage means storing a signal value representative of the said desired frequency;
    a first pulse generating means responsive to a first predetermined portion of a cyclic variation in the said given signal to initiate a first pulse period and responsive to a second predetermined portion of the cyclic variation in the said given signal to terminate the first pulse period after a pulse period duration having a predetermined relationship to the frequency of the said given signal;
    a second pulse generating means responsive to the first predetermined portion of the cyclic variation of the given signal to initiate a second pulse period, substantially simultaneously with the initiation of the first pulse period, and responsive to the stored signal to terminate the second pulse period after a pulse period duration bearing the same said predetermined relationship to the desired frequency;
    means responsive to the first and second pulse period durations for generating a correcting signal varying with the time difference between the said durations;
    the frequency-modifying means being responsive to the correcting signal to modify the frequency of the said given signal in a sense such as to reduce the difference in the said pulse period durations.

5. A frequency lock loop according to claim 10 further including means responsive to the leading edge of each output pulse from the second pulse generating means for terminating the pulse after a predetermined delay.

6. A frequency lock loop according to claim 5 in which the delay is adjustable to permit adjustment of the said desired frequency.

* * * * *